(12) United States Patent
Fan et al.

(10) Patent No.: US 12,062,673 B2
(45) Date of Patent: Aug. 13, 2024

(54) APPARATUS AND METHOD FOR CURVED-SURFACE IMAGE SENSOR

(71) Applicant: OmniVision Technologies, Inc., Santa Clara, CA (US)

(72) Inventors: Chun-Sheng Fan, Zhudong Township (TW); Wei-Feng Lin, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 392 days.

(21) Appl. No.: 17/517,396

(22) Filed: Nov. 2, 2021

(65) Prior Publication Data
US 2023/0136491 A1   May 4, 2023

(51) Int. Cl.
*H01L 27/146*   (2006.01)
*H04N 23/54*   (2023.01)

(52) U.S. Cl.
CPC .. *H01L 27/14618* (2013.01); *H01L 27/14636* (2013.01); *H01L 27/14683* (2013.01); *H04N 23/54* (2023.01)

(58) Field of Classification Search
None
See application file for complete search history.

(56) References Cited

U.S. PATENT DOCUMENTS

| | | | |
|---|---|---|---|
| 9,998,643 B2 | 6/2018 | Sulfridge et al. | |
| 10,304,900 B2 * | 5/2019 | Keefe | H01L 27/14601 |
| 10,361,235 B2 * | 7/2019 | Yang | H01L 27/14607 |
| 10,943,938 B2 * | 3/2021 | Chiang | H01L 27/1469 |
| 2002/0025656 A1 * | 2/2002 | Arai | H01L 21/67132 257/E21.599 |
| 2005/0035514 A1 * | 2/2005 | Hillman | H01L 21/6838 269/21 |
| 2005/0263836 A1 * | 12/2005 | Okada | H01L 24/32 257/415 |
| 2007/0228502 A1 * | 10/2007 | Minamio | H01L 27/14683 257/431 |
| 2009/0115875 A1 * | 5/2009 | Choi | H04N 25/00 257/E31.127 |
| 2014/0160327 A1 | 6/2014 | Enoki et al. | |
| 2016/0286102 A1 * | 9/2016 | Sulfridge | B29C 66/81455 |
| 2016/0293429 A1 * | 10/2016 | Keefe | H01L 24/83 |
| 2018/0076257 A1 * | 3/2018 | McKnight | H01L 21/304 |

(Continued)

OTHER PUBLICATIONS

Andanta; Curved High Resolution CCD Sensors—Overview; preliminary short form datasheet; Apr. 18, 2013, 2 pages.

(Continued)

*Primary Examiner* — Evren Seven
(74) *Attorney, Agent, or Firm* — COZEN O'CONNOR

(57) ABSTRACT

A curved-surface image-sensor assembly has a porous carrier having a concave surface with a thinned image sensor bonded by an adhesive to its concave surface of the porous carrier; the porous carrier is mounted into a water-resistant package. The sensor assembly is made by fabricating a thinned, flexible, image-sensor integrated circuit (IC) and applying adhesive to a non-illuminated side of the IC; positioning the IC over a concave surface of a porous carrier; applying vacuum through the porous carrier to suck the IC onto the concave surface of the porous carrier; and curing the adhesive to bond the IC to the concave surface of the porous carrier.

8 Claims, 2 Drawing Sheets

(56) References Cited

U.S. PATENT DOCUMENTS

2019/0140008 A1* 5/2019 Chambion ........ H01L 27/14618

OTHER PUBLICATIONS

Guenter, B. et al.; Highly curved image sensors: a practical approach for improved optical performance; vol. 25, No. 12; Jun. 12, 2017; Optics Express; pp. 13010-13023.
Lombardo, S. et al.; Curved Detectors: Astronomical Applications; Northern skies Cosmic Flows, Workshop, LAM, Marseille; Sep. 21, 2018; 16 pages.
Lombardo, S. et al.; Curved detectors for astronomical applications: characterization results on different samples; vol. 58, No. 9; Mar. 20, 2019; Applied Optics; pp. 2174-2182.
AMS Datasheet; CMNV20000 20MP CMOS Machine Vision Image Sensor; Feb. 3, 2020; 62 pages.

* cited by examiner

APPARATUS AND METHOD FOR CURVED-SURFACE IMAGE SENSOR

BACKGROUND

Light from a distant scene focused through a simple single-element lens forms a best-focus, undistorted, image surface that is curved, not flat, typically with a concave radius of curvature approximating a focal length of the lens. Use of such simple refractive lenses to image distant scenes on a flat surface, such as traditional flat film or flat image sensors, results in peripheral distortion and peripheral loss of focus. Similarly, reflecting telescopes may produce an image having an effective convex radius of curvature.

While the human eye has a concave curved retina surface that helps overcome this distortion, curving surfaces of film or image sensors to overcome this distortion has rarely been done. Since the 19th century, correction of this distortion has typically required complex, multi-element, lens systems.

Integrated circuits, including image-sensor integrated circuits, are typically fabricated as multiple integrated-circuit die on flat-surfaced wafers because of the way semiconductor fabrication equipment is designed. These wafers are typically fairly thick to avoid warpage during high-temperature processing.

Some wafers, and the integrated circuits on them, are thinned after high temperature processing to form transistors and other circuit elements on their "front-side" surfaces. Among thinned wafers are those bearing backside-illuminated image sensors and single-crystal solar cells for bendable solar panels. Thinning greatly increases flexibility of circuits.

A thinned CMV20000 image sensor (Austria Mikro Systeme International Aktiengesellschaft m.b.H., Premstätten, Austria) has previously been studied, see *Curved detectors for astronomical applications: characterization results on different samples*, by Simona Lombardo, et al., Applied Optics Vol. 58, No. 9/20 Mar. 2019 (Lombardo). The Lombardo article describes image sensors that have been thinned and deformed with both concave and convex curvature with 150 mm radius of curvature.

Similarly, U.S. Pat. No. 9,998,643 describes a method of forming a curved image sensor involving positioning a thinned image sensor over an adhesive-coated, curved-surface, substrate and using compressed gas or a mechanical plunger to force the image sensor onto the curved-surface substrate. During positioning and curving of the image sensor, it is possible to chip an edge of the image sensor particularly if the image sensor is clamped to the curved-surface substrate. It is also possible for air to reach the non-illuminated side of the image sensor causing the process to fail, or for an air bubble to remain under the image sensor circuit after air pressure is used to force the image sensor into the cavity of the curved-surface substrate.

SUMMARY

In an embodiment, a curved-surface image sensor assembly has a porous carrier having a concave surface with a thinned image sensor bonded by an adhesive to its concave surface of the porous carrier; the porous carrier is mounted into a water-resistant package.

In an embodiment, the sensor assembly is made by fabricating a thinned, flexible, image-sensor integrated circuit (IC) and applying adhesive to a non-illuminated side of the IC; positioning the IC over a concave surface of a porous carrier; applying vacuum through the porous carrier to suck the IC onto the concave surface of the porous carrier; and curing the adhesive to bond the IC to the concave surface of the porous carrier.

DETAILED DESCRIPTION OF THE EMBODIMENTS

Figure 1:
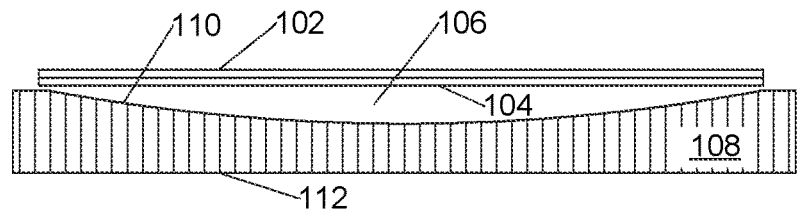
FIG. 1 is a cross sectional view of a thinned image sensor integrated circuit with a layer of adhesive applied and positioned over a concave porous substrate.
Figure 2:
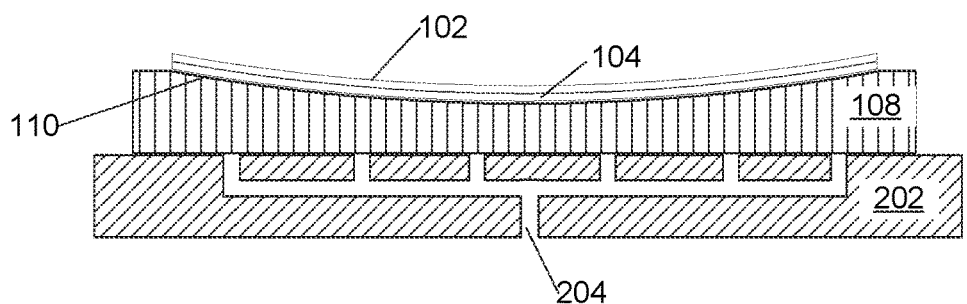
FIG. 2 is a cross sectional view of a thinned image sensor integrated circuit with a layer of adhesive fixing the thinned image sensor integrated circuit to the concave porous substrate as achieved following application of vacuum to the concave porous substrate, the concave porous substrate shown positioned on a vacuum distribution fixture.
Figure 3:
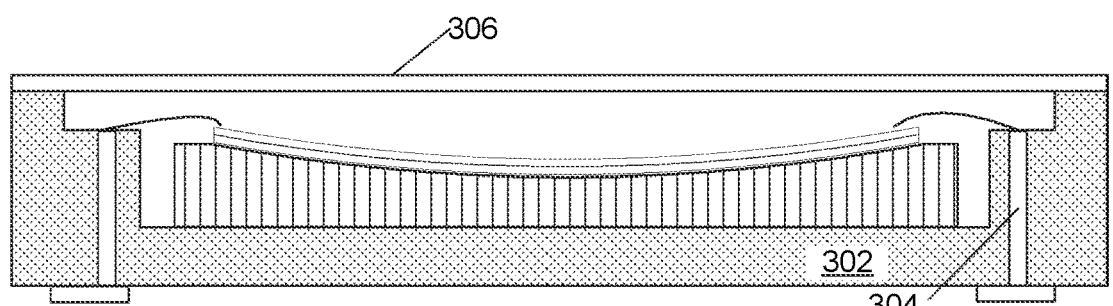
FIG. 3 is a cross sectional view of a thinned image sensor integrated circuit with a layer of adhesive fixing it to the concave porous substrate, and with the concave porous substrate packaged in a non-porous, waterproof, package ready for assembly into a camera.
Figure 5:
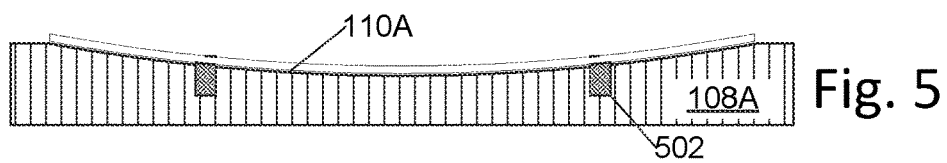
FIG. 5 is a cross sectional view of a thinned image sensor integrated circuit of an alternative embodiment with a ring of adhesive fixing the thinned image sensor integrated circuit to the concave porous substrate as achieved following application of vacuum to the concave porous substrate.
Figure 6:
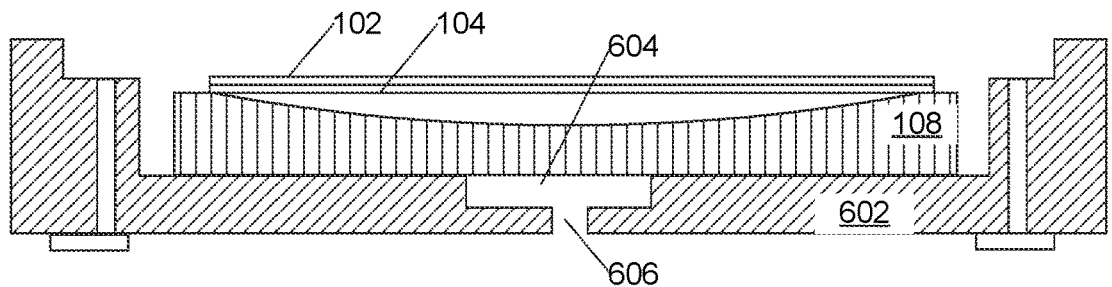
FIG. 6 is a cross sectional view of a thinned image sensor integrated circuit of an alternative embodiment where the non-porous package beneath the concave porous substrate has vacuum distribution channels and serves as the vacuum distribution fixture, illustrated with the thinned image sensor integrated circuit is positioned over the concave porous substrate but before vacuum is applied.
Figure 4:
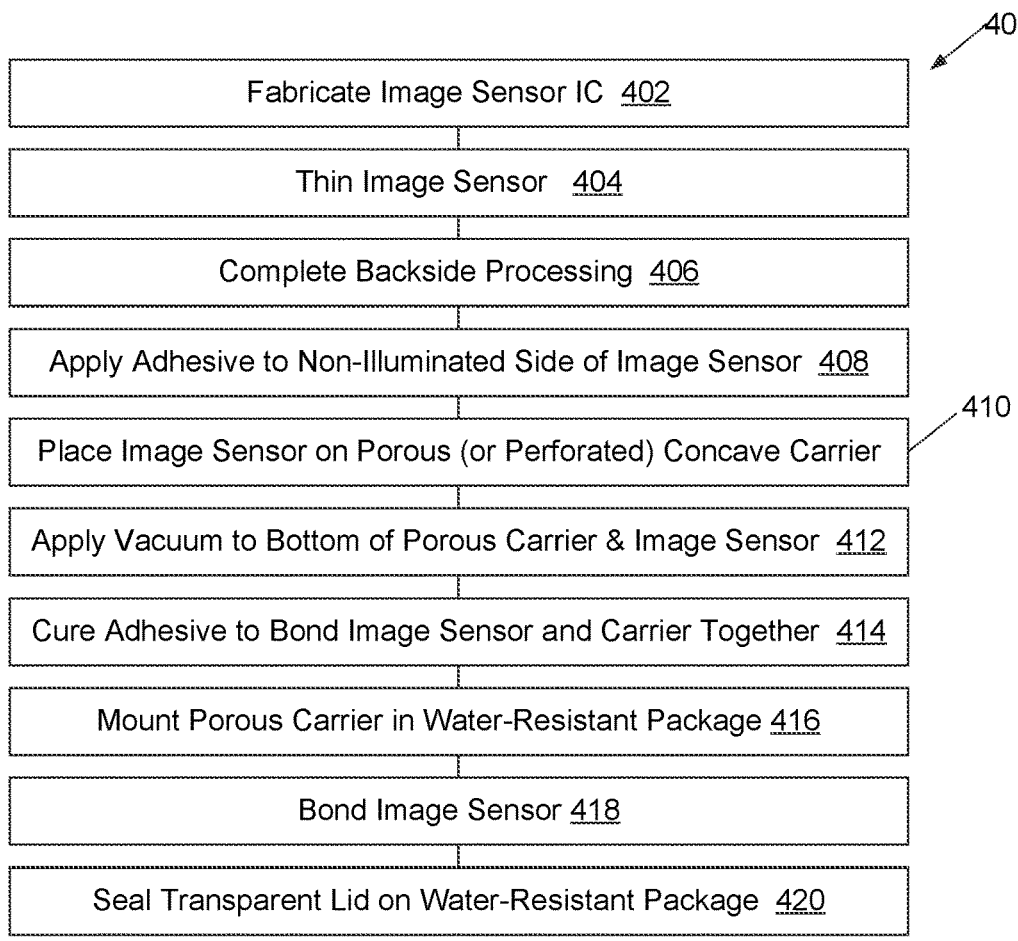
FIG. 4 is a flowchart of a method of assembly of a curved-surface image sensor.

A curved-surface image-sensor assembly, adapted to be included within telescopes or cameras, is manufactured according to method 400 (FIG. 4). With reference to FIGS. 1 and 4, in an embodiment, an image sensor integrated circuit (IC) is fabricated 402 as known in the art of CMOS and CCD image sensors. The image sensor integrated circuit (hereinafter image sensor) 102 is thinned 404 to make it flexible in a manner similar to thinning of backside-illuminated image sensors. Any necessary backside processing, such as addition of color filters and/or microlenses for backside illuminated image sensors, and addition of substrate metallization for frontside illuminated image sensors, is then performed 406.

For purposes of this document, the side of the image sensor 102 onto which image light is expected to be focused is known as the illuminated side and the side of the image sensor 102 opposite the illuminated side is known as the non-illuminated side.

The image sensor is assembled into a curved-surface image sensor assembly 700, 800 following the method of FIG. 4 with intermediate steps illustrated in FIGS. 1-3, and 5-6. In an embodiment, a coating, or thin layer, of adhesive 104 is applied to the non-illuminated side of the image sensor 102; in some embodiments this non-illuminated side is the backside of frontside-illuminated image sensors, and in other embodiments this non-illuminated side is the frontside of backside-illuminated image sensors. The image sensor 102 is then placed 410 over a concave cavity 106 of a porous carrier 108.

In some embodiments, adhesive 104 is a thin layer of a hot-melt adhesive. In other embodiments adhesive 104 is a thin layer of a thermosetting epoxy.

In some embodiments, porous carrier 108 is a plastic or ceramic carrier that has had a pattern of microholes laser-drilled through it so air can pass from its concave surface 110 to its bottom, flat, surface 112. In some other embodiments, carrier 108 is formed of a porous ceramic. In other embodiments, carrier 108 is formed by powder metallurgy where metal powders are formed to shape, then fired at a temperature high enough that the metal particles are sintered together but low enough that the metal particles do not melt, thus leaving the carrier porous; aluminum, bronze, brass, copper, gold, silver, or steel particles may be sintered to form a porous carrier. Carriers formed by powder metallurgy have higher thermal conductivity than carriers formed of laser-drilled plastic and may be preferred for systems, like some infrared image sensors, that require active cooling.

In an embodiment, the porous or perforated carrier 108 and image sensor 102 are placed 410 on a vacuum chuck 202 (FIG. 2) having vacuum distribution passages 204 that are coupled to a vacuum pump (not shown). Vacuum is applied 412 through the vacuum chuck 202 and porous carrier 108 to suck the image sensor 102 downward, deforming the image sensor 102 such that the image sensor 102, adhesive 104, and concave surface 110 are in contact. The adhesive is then cured 414, in some embodiments by heating vacuum chuck 202, to bond the image sensor 102 to the carrier 108.

In embodiments, the carrier 108 with attached image sensor 102 is mounted 416 onto a flat surface in the interior of a non-porous water-resistant package 302 (FIG. 3) having feedthroughs 304. The image sensor 102 is then bonded 418, in embodiments, by wirebonding bondpads of the image sensor 102 to feedthroughs 304 of the water-resistant package, and a transparent lid 306 may be sealed 420 over the image sensor. In an alternative embodiment, bonding of the image sensor is achieved by ball bonding and in another alternative embodiment bonding of the image sensor is performed with an anisotropic conductive polymer film.

In an alternative embodiment (FIG. 5), instead of a full layer of adhesive 104, one or more circular grooves 502 is formed on the concave surface 110A of the porous carrier 108A, the groove or grooves being slightly overfilled with adhesive. When the carrier 108A and image sensor 102 are placed on the vacuum chuck 202, vacuum is applied 412, and adhesive melted or cured 414, typically by heat, the image sensor 102 is thus bonded to the carrier 108A. Remaining steps are as described with reference to FIG. 4.

Figure 7:
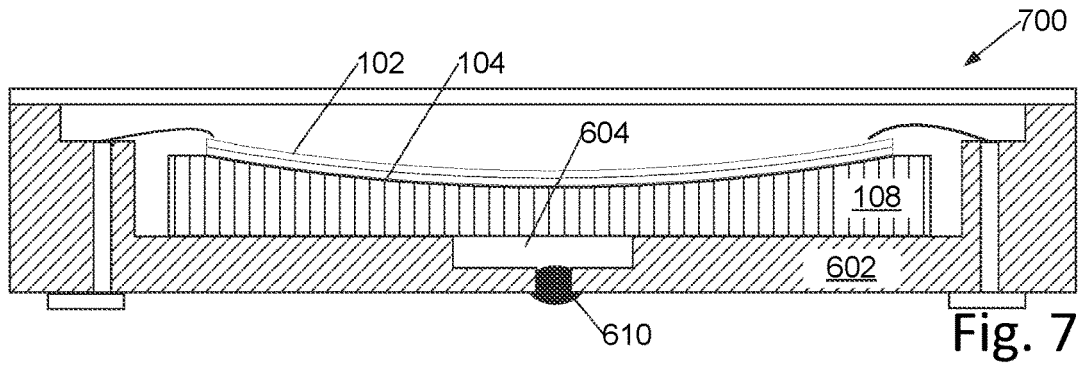
FIG. 7 is a cross sectional view of the embodiment of FIG. 6 after application of vacuum, wirebonding, and attachment of a cover glass to the package.
Figure 8:
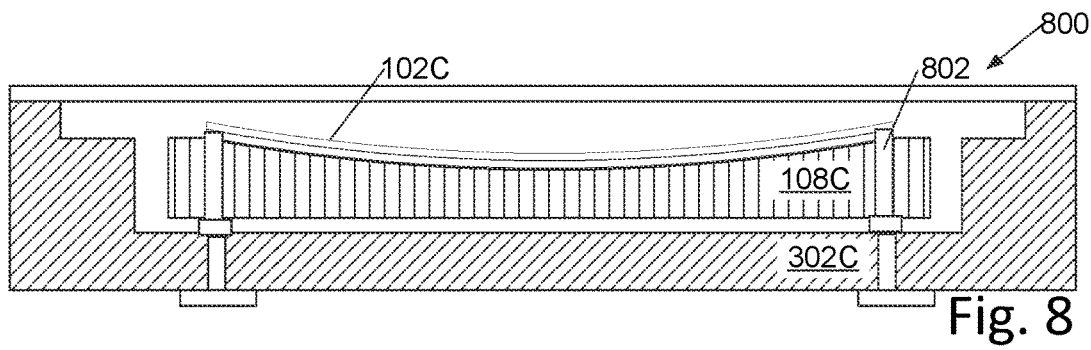
FIG. 8 is a cross sectional view of an alternative embodiment where plated-through holes in the concave porous substrate and solder bumps on the image sensor integrated circuit replace wirebonding.

In an alternative embodiment, after placing image sensor 102 with adhesive 104 on carrier 108, carrier 108 is mounted in a water-resistant package 602 having formed within it vacuum passages 604, passages 604 being accessible through a hole 606. The vacuum is applied 412 through hole 606, adhesive melted or cured 414, typically by heat, bonded 418, and sealed 420. In this embodiment, hole 606 is sealed with a plug 610 (FIG. 7).

In another alternative embodiment, solder bumps (not shown) are formed on bondpads of the non-illuminated surface of image sensor 102C. Electrical conductors 802 are formed through porous carrier 108C, in this embodiment carrier 108C is formed of a non-conductive plastic or ceramic. After vacuum is applied 412 and adhesive melted or cured 414, instead of wirebonding, the solder bumps are melted to bond the bondpads of the image sensor 102C to electrical conductors 802 of the water-resistant package 302C.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A curved-surface image-sensor assembly, comprising:
    a porous carrier having a concave surface and a flat surface;
    a thinned image sensor bonded by an adhesive to the concave surface of the porous carrier; and
    a water-resistant package having an interior surface to which the flat surface of the porous carrier is mounted.
2. The image sensor assembly of claim 1, wherein the image sensor is wirebonded to feedthroughs of the water-resistant package.
3. The image sensor assembly of claim 1, wherein the image sensor is solder-bump bonded to electrical conductors of the porous carrier.
4. The image sensor assembly of claim 1, where the adhesive is cured by heat.
5. The image sensor assembly of claim 2, where the adhesive is cured by heat.
6. The image sensor assembly of claim 3, where the adhesive is cured by heat.
7. The image sensor assembly of claim 2, where the waterproof package has vacuum passages formed within it.
8. The image sensor assembly of claim 3, where the water-resistant package has vacuum passages formed within it.

* * * * *